(12) United States Patent
Shao et al.

(10) Patent No.: US 11,977,827 B2
(45) Date of Patent: May 7, 2024

(54) METHODS, INTERNET OF THINGS SYSTEMS, AND STORAGE MEDIUMS FOR MANAGEMENT OF PIPELINE NETWORK INSPECTION BASED ON SMART GAS GEOGRAPHIC INFORMATION SYSTEMS

(71) Applicant: CHENGDU QINCHUAN IOT TECHNOLOGY CO., LTD., Sichuan (CN)

(72) Inventors: Zehua Shao, Chengdu (CN); Yong Li, Chengdu (CN); Junyan Zhou, Chengdu (CN)

(73) Assignee: CHENGDU QINCHUAN IOT TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 18/360,781

(22) Filed: Jul. 27, 2023

(65) Prior Publication Data
US 2023/0367935 A1 Nov. 16, 2023

(30) Foreign Application Priority Data
Jun. 21, 2023 (CN) .......................... 202310740119.1

(51) Int. Cl.
*G06F 30/28* (2020.01)
*G16Y 10/35* (2020.01)

(52) U.S. Cl.
CPC .............. *G06F 30/28* (2020.01); *G16Y 10/35* (2020.01)

(58) Field of Classification Search
CPC ......... G06F 30/28; G16Y 10/35; Y02P 90/30; G06Q 10/06; G06Q 50/06
See application file for complete search history.

(56) References Cited

U.S. PATENT DOCUMENTS

| | | | |
|---|---|---|---|
| 9,041,794 B1 * | 5/2015 | Olsson ................... | H04N 7/185 348/374 |
| 2013/0211797 A1 * | 8/2013 | Scolnicov .............. | G06Q 50/06 703/2 |

(Continued)

FOREIGN PATENT DOCUMENTS

| CN | 106570649 A | 4/2017 |
|---|---|---|
| CN | 108377034 A | 8/2018 |

(Continued)

OTHER PUBLICATIONS

Jiang, Biao et al., The Design Research of Power Cable Channel Patrol System based on Intelligent Terminal, Electrical Technology, 2017, 4 pages.

(Continued)

*Primary Examiner* — Steven W Crabb
(74) *Attorney, Agent, or Firm* — METIS IP LLC

(57) ABSTRACT

The embodiments of the present disclosure provide methods, Internet of Things systems, and storage mediums for management of pipeline network inspection based on a smart gas geographic information system (GIS). The method is implemented by a smart gas pipeline network safety management platform of an Internet of Things system for management of pipeline network inspection based on the smart gas GIS, and the method comprises: obtaining inspection features of at least one inspection unit in a gas pipeline network based on the smart gas GIS; determining at least one gas inspection area by dividing a gas pipeline network map of the smart gas GIS based on the inspection features; determining an inspection result by performing an inspection based on the at least one gas inspection area; and updating the at least one gas inspection area based on the inspection result.

2 Claims, 6 Drawing Sheets

(56) References Cited

U.S. PATENT DOCUMENTS

2018/0332370 A1* 11/2018 Shao ..................... H04L 67/12
2023/0125033 A1   4/2023 Shao et al.

FOREIGN PATENT DOCUMENTS

| CN | 110185937 | A | 8/2019 |
| CN | 110398571 | A | 11/2019 |
| CN | 112434957 | A | 3/2021 |
| CN | 112729315 | A | 4/2021 |
| CN | 113778088 | A | 12/2021 |
| CN | 114971224 | A | 8/2022 |
| CN | 115509184 | A | 12/2022 |
| CN | 115907264 | A | 4/2023 |
| CN | 116011740 | A | 4/2023 |
| KR | 102395169 | A | 5/2022 |

OTHER PUBLICATIONS

Notification to Grant Patent Right for Invention in Chinese Application No. 202310740119.1 dated Aug. 14, 2023, 4 pages.
First Office Action in Chinese Application No. 202310740119.1 dated Jul. 28, 2023, 14 pages.

* cited by examiner

300

310
Determining a sum of workloads of a plurality of inspection units in at least one inspection sub-graph after clustering

320
Updating the at least one inspection sub-graph in response to the sum of workloads exceeding a workload threshold

330
Determining a sum of workloads of at least one updated inspection sub-graph, and comparing the sum of workloads of the at least one updated inspection sub-graph with the workload threshold to determine whether to continue updating the at least one inspection sub-graph

340
Determining a division result of the gas inspection area in response to the sum of workloads of the at least one inspection sub-graph being smaller than or equal to the workload threshold

FIG. 3

METHODS, INTERNET OF THINGS SYSTEMS, AND STORAGE MEDIUMS FOR MANAGEMENT OF PIPELINE NETWORK INSPECTION BASED ON SMART GAS GEOGRAPHIC INFORMATION SYSTEMS

CROSS-REFERENCE TO RELATED APPLICATION

This application claims priority of Chinese Patent Application No. 202310740119.1, filed on Jun. 21, 2023, the contents of which are entirely incorporated herein by reference.

TECHNICAL FIELD

The present disclosure relates to the technical field of the Internet of Things, and in particular, to methods, Internet of Things systems, and storage mediums for management of pipeline network inspection based on a smart gas geographic information system (GIS).

BACKGROUND

At present, gas has been widely applied to many fields of social life and production. However, a gas pipeline network may inevitably fail in a process of transporting gas. The main way for reducing occurrence of failures is to assign an inspector through a gas platform to inspect an area where the gas pipeline network belongs. However, a universal and conventional inspection way may lead to an untargeted gas inspection, which consumes manpower and material resources and makes it difficult to find an abnormality in the operation of the gas pipeline network in time.

Therefore, it is desirable to provide methods, Internet of Things systems, and mediums for management of pipeline network inspection based on a smart gas geographic information system (GIS), so as to improve pertinence and accuracy of the gas pipeline network inspection and enable the stable operation of the gas pipeline network in a timely and effective manner.

SUMMARY

One or more embodiments of the present disclosure provide a method for management of pipeline network inspection based on a smart gas geographic information system (GIS). The method is implemented by a smart gas pipeline network safety management platform of an Internet of Things system for management of pipeline network inspection based on the smart gas GIS, and the method comprises: obtaining inspection features of at least one inspection unit in a gas pipeline network based on the smart gas GIS, wherein the inspection features include at least one of location features, required inspection time, inspection frequency, or a pipeline system of the at least one inspection unit; determining at least one gas inspection area by dividing a gas pipeline network map of the smart gas GIS based on the inspection features; determining an inspection result by performing an inspection based on the at least one gas inspection area; and updating the at least one gas inspection area based on the inspection result.

One or more embodiments of the present disclosure provide an Internet of Things system for management of pipeline network inspection based on a smart gas geographic information system (GIS). The Internet of Things system includes a smart gas user platform, a smart gas service platform, a smart gas pipeline network safety management platform, and a smart gas pipeline network device sensing network platform, and a smart gas pipeline network device object platform. The smart gas user platform includes a plurality of smart gas user sub-platforms; the smart gas service platform includes a plurality of smart gas service sub-platforms; the smart gas pipeline network safety management platform includes at least one smart gas pipeline network safety management sub-platform and a smart gas data center; the smart gas pipeline network device sensing network platform is configured to interact with the smart gas data center and the smart gas pipeline network device object platform; the smart gas pipeline network device object platform is configured to obtain inspection features of at least one inspection unit in a gas pipeline network; the smart gas pipeline network safety management platform is configured to obtain the inspection features from the smart gas data center, determine at least one gas inspection area by dividing a gas pipeline network map of the smart gas GIS based on the inspection features, determine an inspection result by performing an inspection based on the at least one gas inspection area, update the at least one gas inspection area based on the inspection result, and transmit the at least one gas inspection area after updating to the smart gas service platform through the smart gas data center, and the smart gas service platform is configured to upload the at least one gas inspection area after updating to the smart gas user platform.

One or more embodiments of the present disclosure provide a non-transitory computer-readable storage medium. The storage medium stores computer instructions, and when a computer reads the computer instructions in the storage medium, the computer executes the method for management of pipeline network inspection based on the smart gas geographic information system (GIS).

One or more embodiments of the present disclosure aim to solve problems of untargeted gas inspection, consumption of manpower and material resources, and difficulty in finding an abnormality in the operation of the gas pipeline network in time caused by a universal and conventional inspection way. By obtaining the inspection features in the gas pipeline network, determining the gas inspection area based on the inspection features, and adjusting the gas inspection area in time based on real-time inspection features and a possible abnormality, efficiency and pertinence of the management of the pipeline network inspection can be improved, and stable and safe operation of the gas pipeline network can be ensured.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, wherein:

FIG. 3 is a flowchart illustrating an exemplary process for determining a gas inspection area according to some embodiments of the present disclosure;

DETAILED DESCRIPTION

Figure 1:
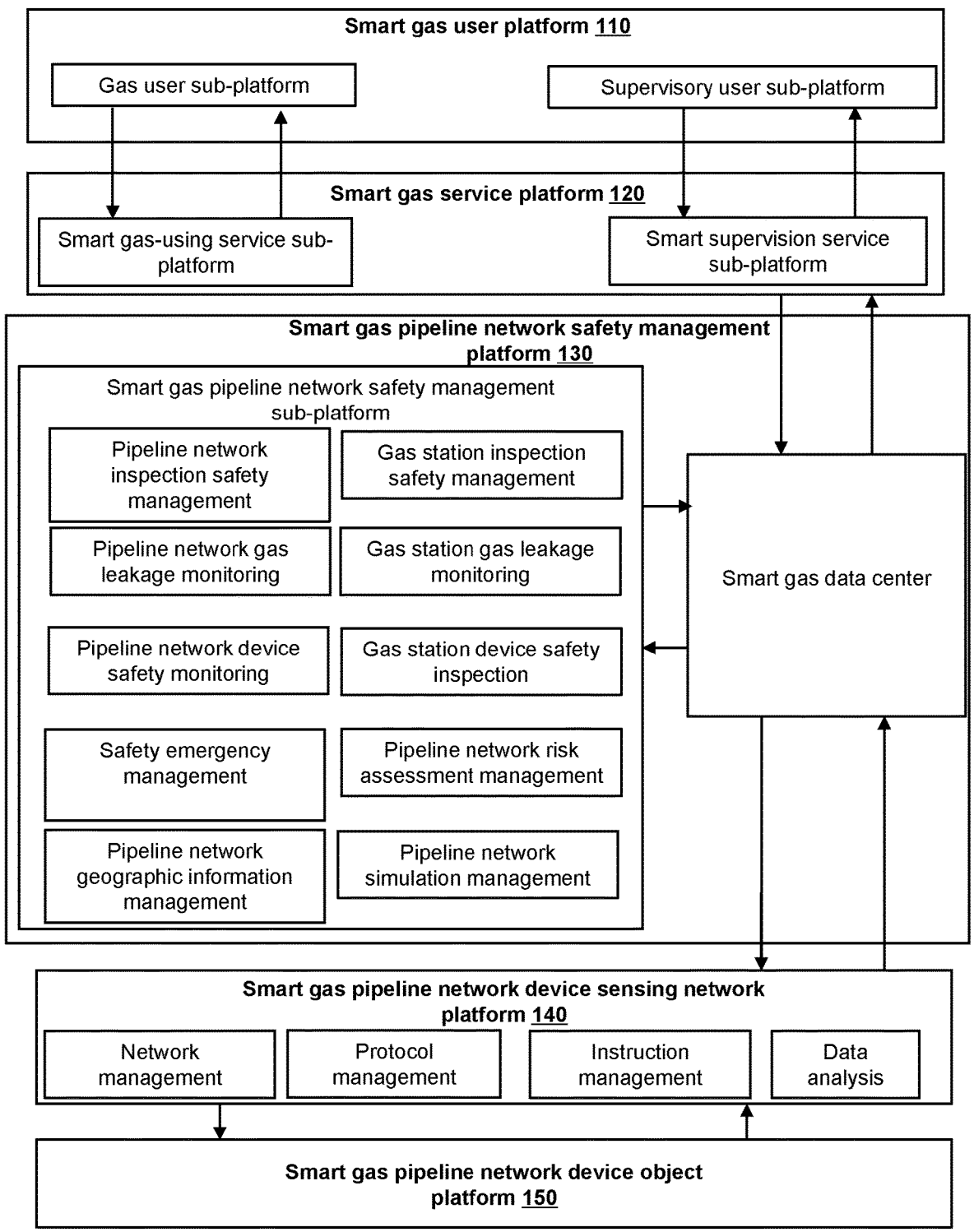
FIG. 1 is a diagram illustrating an exemplary platform structure of an Internet of Things system for management of pipeline network inspection based on a smart gas geographic information system (GIS) according to some embodiments of the present disclosure.

In order to more clearly illustrate the technical solutions related to the embodiments of the present disclosure, a brief introduction of the drawings referred to the description of the embodiments is provided below. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that the "system," "device," "unit," and/or "module" used herein are one method to distinguish different components, elements, parts, sections, or assemblies of different levels. However, if other words can achieve the same purpose, the words can be replaced by other expressions.

As used in the disclosure and the appended claims, the singular forms "a," "an," and "the" include plural referents unless the content clearly dictates otherwise; the plural forms may be intended to include singular forms as well. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The flowcharts used in the present disclosure illustrate operations that the system implements according to the embodiment of the present disclosure. It should be understood that the foregoing or following operations may not necessarily be performed exactly in order. Instead, the operations may be processed in reverse order or simultaneously. Besides, one or more other operations may be added to these processes, or one or more operations may be removed from these processes.

Environmental conditions and gas transportation conditions of different areas covered by gas pipeline networks are different, and abnormality possibility and abnormality time are also different. In order to improve efficiency of gas pipeline network inspection, it is necessary to consider the abnormality possibility in different areas when assigning inspectors to inspect the areas covered by gas pipeline networks. Therefore, in some embodiments of the present disclosure, inspection features in a gas area are obtained according to a gas geographic information system (GIS), and at least one gas inspection area is determined based on the inspection features, which can improve inspection efficiency and pertinence in the areas covered by the gas pipeline networks, and enable the gas pipeline network operates stably and safely.

FIG. 1 is a diagram illustrating an exemplary platform structure of an Internet of Things system for management of pipeline network inspection based on a smart gas geographic information system (GIS) according to some embodiments of the present disclosure. The Internet of Things system for management of the pipeline network inspection based on the smart gas GIS (which is referred to as the IoT system 100 hereinafter) involved in the embodiments of the present disclosure is described in detail below. It should be noted that the following embodiments are only used to illustrate the present disclosure, and do not constitute a limitation to the present disclosure.

As shown in FIG. 1, the IoT system 100 may include a smart gas user platform 110, a smart gas service platform 120, a smart gas pipeline network safety management platform 130, a smart gas pipeline network device sensing network platform 140, and a smart gas pipeline network device object platform 150.

The smart gas user platform 110 refers to a platform for interacting with a user. In some embodiments, the smart gas user platform 110 may be configured as a terminal device.

In some embodiments, the smart gas user platform 110 may include a gas user sub-platform and a supervisory user sub-platform. The gas user sub-platform may be a platform that provides a gas user with data related to gas use and solutions to gas problems. The gas user may be an industrial gas user, a commercial gas user, an ordinary gas user, etc. The supervisory user sub-platform may be a platform for a supervisory user to supervise operation of the IoT system. The supervisory user may be a member of a gas safety supervision department.

In some embodiments, the smart gas user platform 110 may feedback information to users through the terminal device. For example, the smart gas user platform 110 may feedback an updated gas inspection area to the supervisory user based on the supervisory user sub-platform.

The smart gas service platform 120 refers to a platform for conveying a user requirement and control information. The smart gas service platform 120 may obtain the updated gas inspection area, etc. from the smart gas pipeline network safety management platform 130 (e.g., a smart gas data center), and send it to the smart gas user platform 110.

In some embodiments, the smart gas service platform 120 may include a smart gas-using service sub-platform and a smart supervision service sub-platform. The smart gas-using service sub-platform may be a platform that provides a gas-using service for the gas user. The smart supervision service sub-platform may be a platform that provides a supervisory requirement and a supervisory solution for the supervisory user.

In some embodiments, the smart gas service platform may upload at least one updated gas inspection area to the supervisory user sub-platform of the smart gas user platform 110 based on the smart supervision service sub-platform.

The smart gas pipeline network safety management platform 130 refers to a platform that provides functions of sensing management and control management for an Internet of Things operating system. In some embodiments, the smart gas pipeline network safety management platform may include a smart gas pipeline network safety management sub-platform and a smart gas data center.

The smart gas pipeline network safety management sub-platform may be configured to process inspection features, determine, and update the gas inspection area. The smart gas data center may collect and store operation data of the IoT system 100.

In some embodiments, the smart gas pipeline network safety management platform 130 may perform data interaction with the smart gas pipeline network device sensing network platform 140 and the smart gas service platform 120 (e.g., the smart supervision service sub-platform) through the smart gas data center.

For example, the smart gas data center may upload the gas inspection area to the smart gas service platform 120. As another example, the smart gas data center may send instructions for obtaining the inspection features to the smart gas pipeline network device sensing network platform 140 to obtain the inspection features.

In some embodiments, the smart gas pipeline network safety management sub-platform may include modules for implementing pipeline network inspection safety management, gas station inspection safety management, pipeline network gas leakage monitoring, gas station leakage monitoring, pipeline network device safety monitoring, gas station device safety inspection, safety emergency management, pipeline network risk assessment management, pipeline network geographic information management, and pipeline network simulation management, etc.

The smart gas pipeline network device sensing network platform 140 refers to a functional platform for managing sensor communication. In some embodiments, the smart gas pipeline network device sensing network platform 140 may be configured as a communication network and a gateway to implement functions of perceptual information sensing communication and control information sensing communication.

In some embodiments, the smart gas pipeline network device sensing network platform 140 may perform data interaction with the smart gas pipeline network safety management platform 130 through the smart gas data center; and perform data interaction with the smart gas pipeline network device object platform 150, etc.

The smart gas pipeline network device object platform 150 refers to a functional platform for obtaining perceptual information. In some embodiments, the smart gas network device object platform 150 may be configured as various types of gas network devices and monitoring devices. The monitoring devices may include gas flow devices, image acquisition devices, temperature and humidity sensors, pressure sensors, gas leakage alarms, etc.

In some embodiments, the smart gas pipeline network device object platform 150 may also be configured to obtain inspection features of at least one inspection unit in the gas pipeline network from the smart gas GIS.

More descriptions regarding the inspection features, the gas inspection area, and an inspection result of the at least one inspection unit may be found elsewhere in the present disclosure (e.g., FIG. 2) and related descriptions thereof.

It should be noted that the above description of the IoT system 100 and its components is only for convenience of description, and does not limit the present disclosure to the scope of the illustrated embodiments. It may be understood that for those skilled in the art, after understanding the principle of the system, it is possible to arbitrarily combine the various components, or form a sub-system to connect with other components without departing from the principle.

Figure 2:
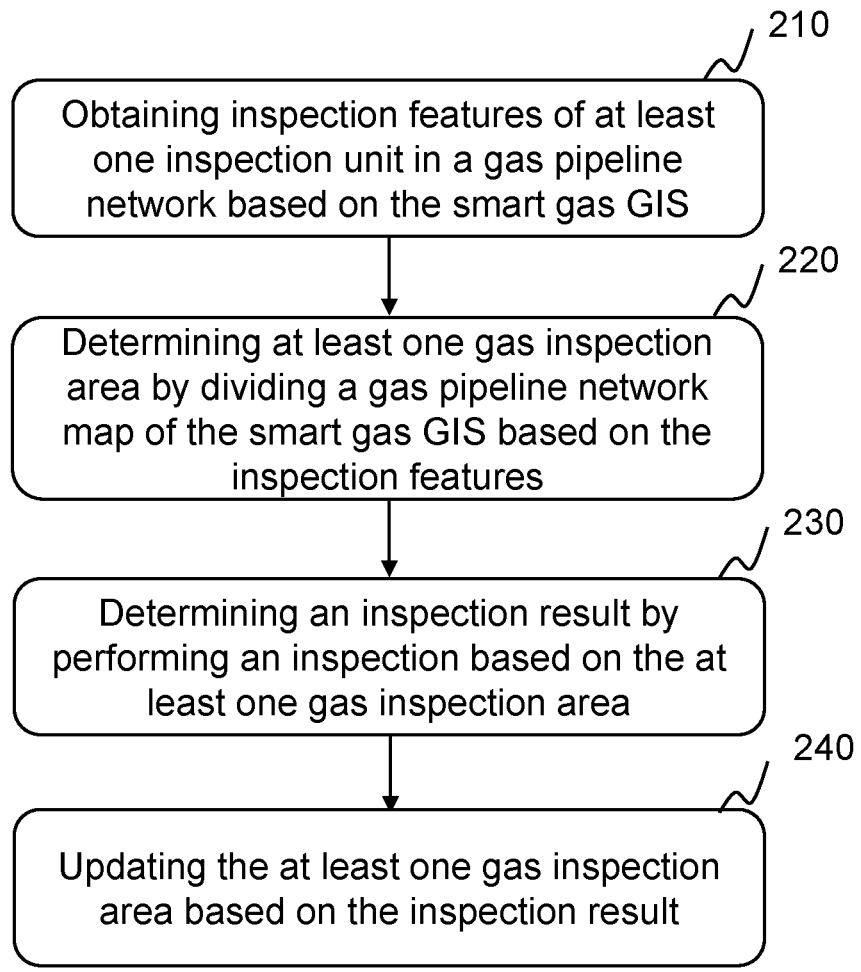
FIG. 2 is a flowchart illustrating an exemplary process of a method for management of pipeline network inspection based on a smart gas geographic information system (GIS) according to some embodiments of the present disclosure.

FIG. 2 is a flowchart illustrating an exemplary process of a method for management of pipeline network inspection based on a smart gas geographic information system (GIS) according to some embodiments of the present disclosure. As shown in FIG. 2, the process 200 may include the following operations. In some embodiments, the process 200 may be executed by the smart gas pipeline network safety management platform 130.

In 210, obtaining inspection features of at least one inspection unit in a gas pipeline network based on the smart gas GIS.

The smart gas GIS is an information system based on geographic information system (GIS) technology, which can provide required gas pipeline network information to the smart gas pipeline network safety management platform 130, and implement functions of dynamic update, query statistics, pipe network operation inspection, etc. of the gas pipeline network information.

The inspection unit refers to an area where a gas pipelines in the gas pipeline network needs to be inspected. For example, the inspection unit may include a gas device, an area where a gas pipeline section is located, etc. that needs to be inspected. The inspection unit may be determined by pre-division.

The inspection features refer to data information related to a gas inspection of the inspection unit.

In some embodiments, the inspection features may include location features, required inspection time, inspection frequency, a pipeline system of the inspection unit, or any combination thereof. The location features may include location coordinates, terrain, inspection difficulty, etc. of the inspection unit. The required inspection time refers to a next inspection time determined according to a requirement of the inspection frequency and a last inspection time. The inspection frequency refers to a time interval between inspections of the inspection unit. The pipeline system of the inspection unit refers to a level and serial number of a pipeline corresponding to the inspection unit in the gas pipeline network.

In some embodiments, the smart gas pipeline network safety management platform 130 may obtain the inspection features of the at least one inspection unit in the gas pipeline network through the smart gas pipeline network device object platform 150.

In 220, determining at least one gas inspection area by dividing a gas pipeline network map of the smart gas GIS based on the inspection features.

The gas inspection area refers to a plurality of small areas divided for inspection and management in an area corresponding to the gas pipeline network. In some embodiments, the area corresponding to the gas pipeline network may be referred to as a gas area. For example, one or more inspection units in the gas area may be grouped into one gas inspection area.

In some embodiments, the smart gas pipeline network safety management platform 130 may determine the at least one gas inspection area by dividing the gas pipeline network map of the smart gas GIS based on the inspection features. For example, inspection units with similar inspection features may be grouped into one gas inspection area.

In some embodiments, the smart gas pipeline network safety management platform 130 may determine the gas inspection area through clustering. Detailed descriptions may be found in FIG. 3 and related descriptions thereof.

In 230, determining an inspection result by performing an inspection based on the at least one gas inspection area.

In some embodiments, an inspector may inspect the gas pipeline in the gas inspection area according to the required inspection time and the inspection frequency of the inspection unit and determine the inspection result.

The inspection result may include whether there is any abnormality in the gas pipeline, a specific abnormality condition of the gas pipeline (e.g., pipeline damage, component missing, pipeline aging), etc.

In some embodiments, the smart gas pipeline network safety management platform 130 may determine the inspection result in various ways. For example, the inspection result is input by the inspector, image recognition and determination based on inspection images, etc.

In 240, updating the at least one gas inspection area based on the inspection result.

For example, the smart gas pipeline network safety management platform 130 updates the inspection features (e.g., update the inspection frequency and the required inspection time) based on a specific abnormality condition (e.g., whether the pipeline is damaged or not) of the gas pipeline in the inspection result, and updates the gas inspection area based on updated inspection features through the manner in the operation 220.

In some embodiments, the smart gas pipeline network safety management platform 130 updates the at least one gas inspection area based on the inspection result. Detailed descriptions may be found in FIG. 4 and related descriptions thereof.

In some embodiments of the present disclosure, the inspection features are obtained through the smart gas GIS, the gas inspection area is determined by dividing the gas pipeline network map, and the gas inspection area is updated in real time based on the inspection result, which can effectively optimize the assignment of inspection tasks, improve inspection efficiency, and adjust inspection resources and tasks timely.

It should be noted that the above description of the process 200 is only for example and illustration, and does not limit the scope of application of the present disclosure. For those skilled in the art, various modifications and changes can be made to the process 200 under the guidance of the present disclosure. However, such modifications and changes are still within the scope of the present disclosure.

In some embodiments, the smart gas pipeline network safety management platform 130 may construct a gas inspection graph based on the gas pipeline network map; determine at least one inspection sub-graph by clustering the gas inspection graph based on the inspection features; and determine the at least one gas inspection area based on the at least one inspection sub-graph. Nodes of the gas inspection graph include the at least one inspection unit, and edges of the gas inspection graph include first type edges; and the first type edges are pipelines between the nodes.

The gas inspection graph refers to an undirected weighted graph used to represent inspection units and connection relationships between the inspection units.

In some embodiments, the smart gas pipeline network safety management platform 130 may construct the gas inspection graph based on the gas pipeline network map by taking the inspection units in the gas area as the nodes and pipelines between the nodes as the first type edges.

Node features of the gas inspection graph may include locations, inspection workloads, the required inspection times, the inspection frequencies, the pipeline systems of the inspection units, etc.

Features of the first type edges of the gas inspection graph may include weights of the edges, and the weights may be determined based on distances between the nodes. For example, it may be set that the greater the distances between the nodes, the smaller the weights of the edges.

The inspection sub-graph refers to a sub-graph formed by dividing the gas inspection graph.

In some embodiments, the smart gas pipeline network safety management platform 130 may cluster the gas inspection graph based on the inspection features of the at least one inspection unit in the gas inspection graph, and the inspection units with the similar inspection features may be clustered into a same group to determine the at least one inspection sub-graph. A clustering manner may include a spectral clustering algorithm. In the spectral clustering algorithm, the smaller the weight of an edge between two nodes (i.e., the inspection units), the easier the two nodes are to be divided into two different inspection sub-graphs, and vice versa. Therefore, an edge between nodes corresponding to inspection units with a father distance may be set with a smaller weight, so that it is easier to assign the nodes corresponding to inspection units to different inspection sub-graphs to ensure rationality of the assignment.

In some embodiments, a count of the clustering may be determined based on types and a count of various inspectors. The edges of the gas inspection graph also include second type edges, which are connections (e.g., virtual connections) between the nodes in the gas inspection graph that are not directly connected to each other by pipelines.

In some embodiments, the smart gas pipeline network safety management platform 130 may determine the weights of the edges based on the distances between the nodes and types of the edges. For example, the farther the distance between two nodes connected by an edge, the smaller the weight of the edge; and weights of the first type edges are greater than that of the second type edges.

The types of inspectors may include senior, intermediate, junior, etc. In some embodiments, the smart gas pipeline network safety management platform 130 may determine a count of groups by performing group matching based on the types of inspectors and a count of each type of inspectors and determine the count of the clustering based on the count of groups. A principle of group matching is to ensure that the count and the types of inspectors in each group are balanced.

In some embodiments of the present disclosure, the count of the clustering is determined based on the types and the count of inspectors, which performs reasonable task assignment based on information of the inspectors; and edges between the nodes that meet a preset condition are determined as the second type edges, and the weights of the second type edges are smaller than that of the first type edges, so that the second type edges are more likely to be cut off in spectral clustering, and nodes that are directly connected to each other by pipelines are divided into a same inspection sub-graph, which effectively improves accuracy of clustering results and makes divided inspection sub-graphs more reasonable.

In some embodiments, the distances between the nodes include a first distance and a second distance; the first distance is determined based on the pipeline system to which the nodes belong and straight-line distances between the nodes; and the second distance is determined based on traffic convenience between the nodes.

In some embodiments, the closer the location distance between the nodes, the closer the first distance; and the closer the serial number of the pipeline system to which the nodes belong, the closer the first distance.

The traffic convenience refers to a degree of convenience between the nodes. In some embodiments, the traffic convenience between two nodes is related to a traffic distance and road smoothness between the two nodes and may be evaluated and determined based on historical traffic data or experience. The higher the traffic convenience, the smaller the second distance.

In some embodiments of the present disclosure, through the first distance and the second distance, the distances between the nodes may be measured more effectively, thereby providing a reliable reference for the division of the gas inspection area.

In some embodiments, the distances between the nodes further include a third distance, and the third distance is negatively correlated to an absolute value of a difference value of the required inspection time between the nodes.

In some embodiments, the smaller the absolute value of a difference value of required inspection time between any two nodes, the larger the third distance.

In some embodiments of the present disclosure, measuring the distances between nodes through the third distance may disperse nodes with similar inspection time requirements into different gas inspection areas, so as to avoid accumulation of inspection tasks and improve inspection efficiency.

In some embodiments, the smart gas pipeline network safety management platform 130 may determine the gas area corresponding to the at least one inspection sub-graph as the at least one gas inspection area based on the at least one inspection sub-graph.

FIG. 3 is a flowchart illustrating an exemplary process for determining a gas inspection area according to some embodiments of the present disclosure. As shown in FIG. 3, the process 300 includes the following operations. In some embodiments, the process 300 may be executed by the smart gas pipeline network safety management platform 130.

In 310, determining a sum of workloads of a plurality of inspection units in at least one inspection sub-graph after clustering.

The sum of workloads may be a sum of workload of completing one inspection for each inspection unit.

In some embodiments, the smart gas pipeline network safety management platform 130 may determine the sum of workloads based on an input of an inspector, or historical inspection experience.

In 320, updating the at least one inspection sub-graph in response to the sum of workloads exceeding a workload threshold.

The workload threshold refers to a threshold for judging whether workloads of the inspection sub-graph exceed a preset limit and may be set according to historical experience.

In some embodiments, when the sums of workloads of the inspection sub-graphs exceed the workload threshold, the smart gas pipeline network safety management platform 130 may update the at least one inspection sub-graph based on a sum of workloads of each inspection sub-graph. For example, at least one inspection unit in the inspection sub-graph whose sum of workloads exceeds the workload threshold is assigned to an inspection sub-graph whose sum of workloads is smaller than the workload threshold.

In some embodiments, the smart gas pipeline network safety management platform 130 may preferentially assign the inspection unit in the inspection sub-graph with the sum of workloads exceeding the workload threshold to an inspection sub-graph with a smallest sum of workloads in adjacent inspection sub-graphs.

In some embodiments of the present disclosure, the inspection unit in the inspection sub-graph with the sum of workloads exceeding the workload threshold is assigned to the adjacent inspection sub-graph with the smallest sum of workloads, which can achieve a balanced distribution of inspection tasks and optimization of resource utilization and improve inspection efficiency and inspection quality.

In 330, determining a sum of workloads of at least one updated inspection sub-graph, and comparing the sum of workloads of the at least one updated inspection sub-graph with the workload threshold to determine whether to continue updating the at least one inspection sub-graph.

In some embodiments, the smart gas pipeline network safety management platform 130 may determine the sum of workloads of the at least one inspection sub-graph based on the manner in the operation 310.

In 340, determining a division result of the gas inspection area in response to the sum of workloads of the at least one inspection sub-graph being smaller than or equal to the workload threshold.

In some embodiments, the smart gas pipeline network safety management platform 130 may determine at least one inspection sub-graph after a last update as the division result of the gas inspection area.

In some embodiments of the present disclosure, according to whether the sum of workloads of the inspection sub-graph exceeds the workload threshold, the inspection sub-graph is updated, which can realize dynamic adjustment and optimization of gas inspection area division and ensure rationality and efficiency of inspection task assignment.

In some embodiments of the present disclosure, the at least one inspection sub-graph is determined by constructing and clustering the gas inspection graph, and a corresponding gas inspection area is determined, which can improve efficiency of management and inspection of the gas pipeline network.

Figure 4:
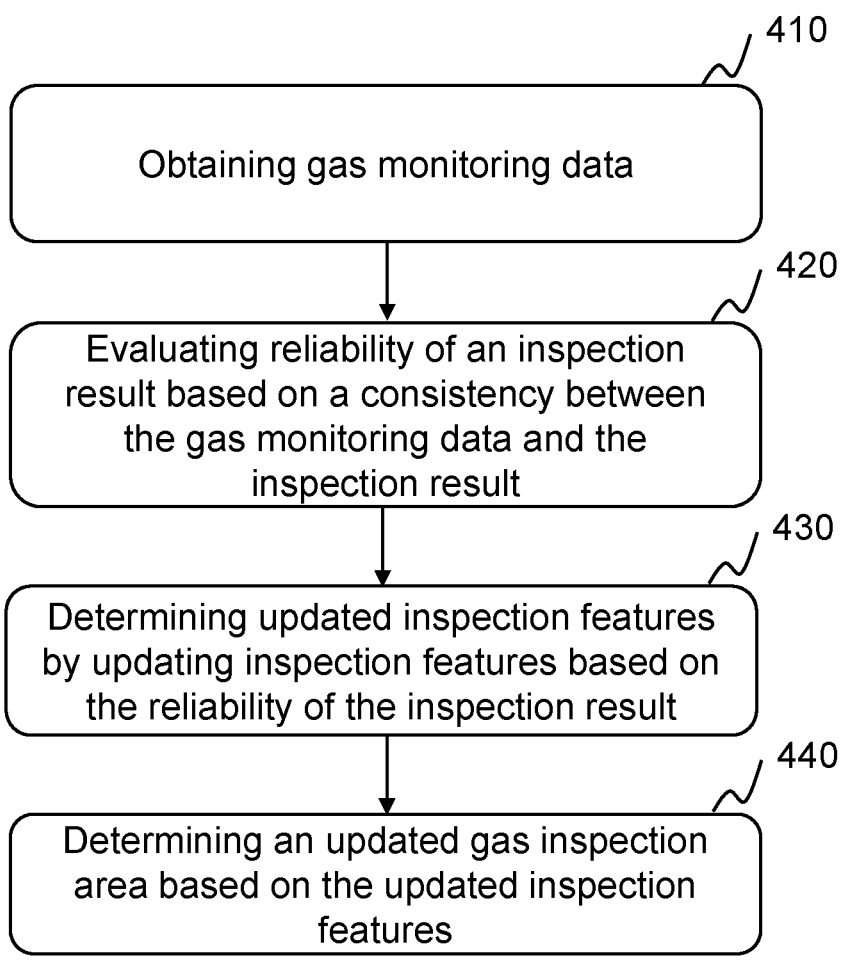
FIG. 4 is a flowchart illustrating an exemplary process for updating a gas inspection area according to some embodiments of the present disclosure.

FIG. 4 is a flowchart illustrating an exemplary process for updating a gas inspection area according to some embodiments of the present disclosure. As shown in FIG. 4, the process 400 includes the following operations. In some embodiments, the process 400 may be executed by the smart gas pipeline network safety management platform 130.

In 410, obtaining gas monitoring data.

The gas monitoring data refers to monitored gas-related data. For example, the gas monitoring data may include a gas flow, a flow velocity, pressure inside a pipeline, a temperature, etc.

In some embodiments, the smart gas pipeline network safety management platform 130 may obtain the gas monitoring data collected by the smart gas pipeline network device object platform 150 through the smart gas pipeline network device sensing network platform 140.

In 420, evaluating reliability of an inspection result based on a consistency between the gas monitoring data and the inspection result.

The reliability refers to a parameter used to evaluate the reliability of the inspection result.

In some embodiments, the smart gas pipeline network safety management platform 130 may evaluate the reliability of the inspection result according to the consistency between the gas monitoring data and the inspection result. The higher the consistency, the higher the reliability.

Figure 5A:
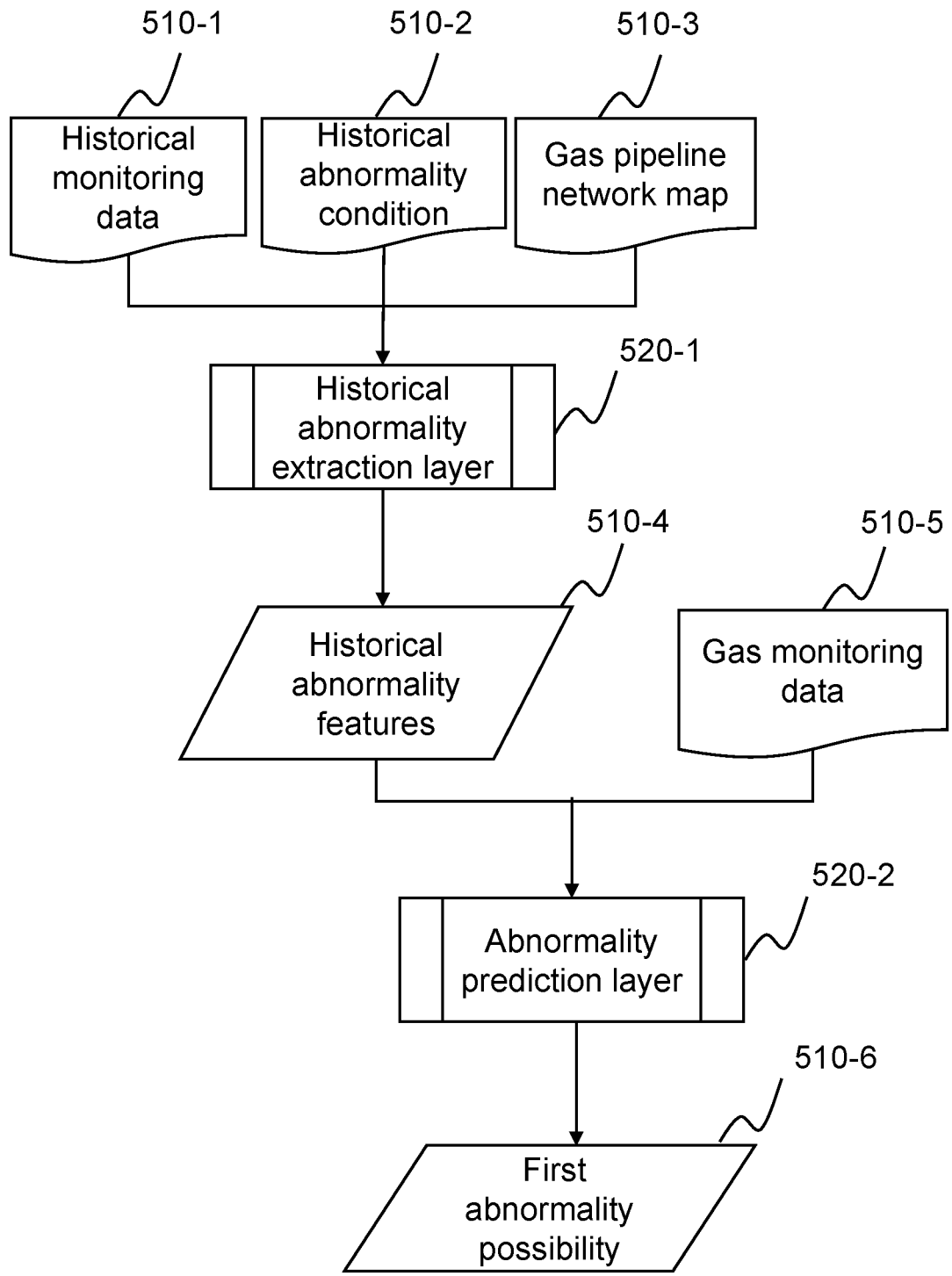
FIG. 5A is an exemplary schematic diagram illustrating predicting a first abnormality possibility based on a first prediction model according to some embodiments of the present disclosure.
Figure 5B:
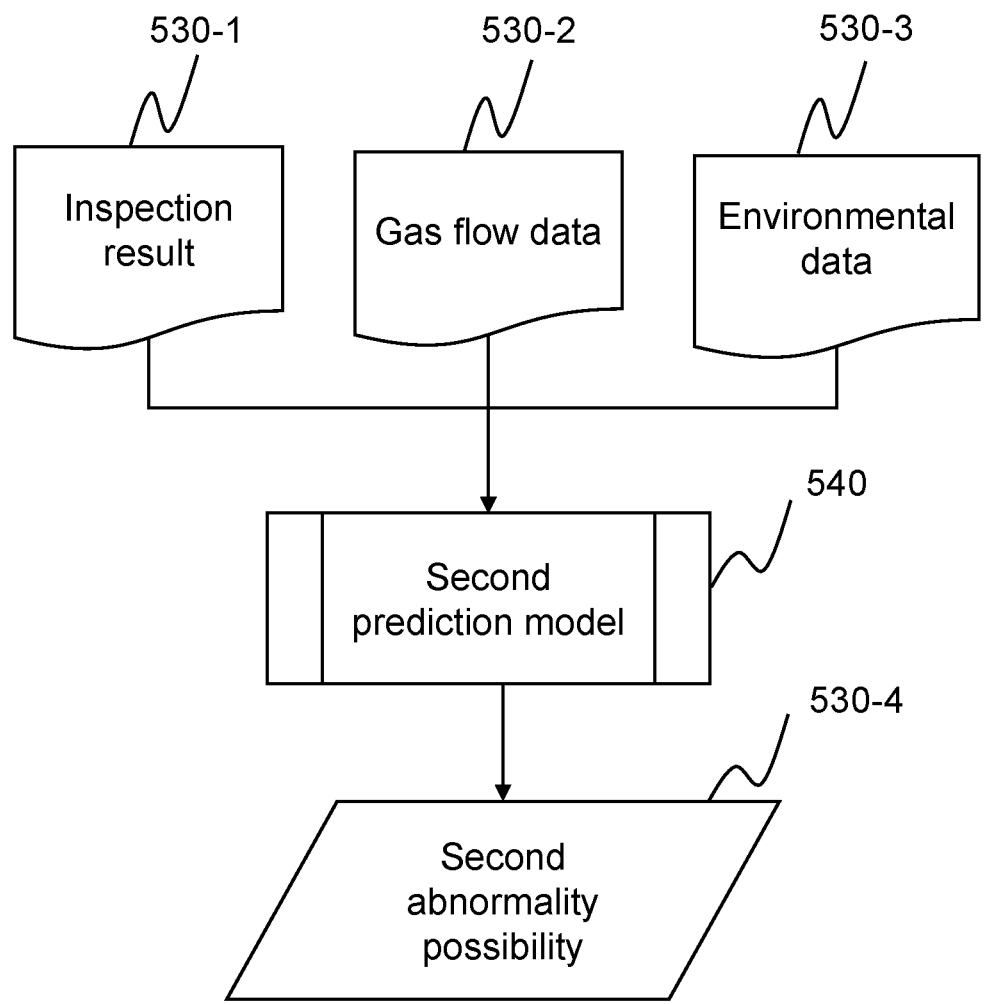
FIG. 5B is an exemplary schematic diagram illustrating predicting a second abnormality possibility based on a second prediction model according to some embodiments of the present disclosure.

In some embodiments, more descriptions regarding the smart gas pipeline network safety management platform 130 determining the reliability of the inspection result may be found in FIG. 5A, FIG. 5B, and related descriptions thereof.

In 430, determining updated inspection features by updating inspection features based on the reliability of the inspection result.

In some embodiments, the smart gas pipeline network safety management platform 130 may update the inspection features of an inspection unit whose reliability is lower than a preset value based on the reliability of the inspection result, and determine the updated inspection features. For example, inspection frequency of an inspection unit whose reliability is lower than a preset reliability standard value is increased, etc.

In some embodiments, the smart gas pipeline network safety management platform 130 may determine the reliability of the inspection result of at least one inspection unit in the gas inspection area and a reliability difference between the reliability of the inspection result and a reliability threshold; adjust required inspection time and inspection frequency of at least one inspection unit based on the reliability difference; and determine the updated inspection features by updating the inspection features based on updated required inspection time and updated inspection frequency.

The reliability threshold refers to a preset reliability reference value for judging whether to adjust the inspection frequency or inspection time of the inspection unit. The reliability threshold may be preset and determined based on an average value of a plurality of consistencies between a plurality of sets of historical gas monitoring data and their corresponding historical inspection results.

In some embodiments, the reliability threshold may be related to an average value of third distances between nodes in an inspection sub-graph corresponding to the gas inspection area.

The third distances between two nodes of a plurality of nodes in the inspection sub-graph corresponding to the gas inspection area may be determined to obtain a plurality of third distances, and the average value may be determined. The smaller the average value of third distances, the larger the reliability threshold. For example, an adjustment coefficient negatively correlated with the average value of third distances may be preset, and the reliability threshold preset based on historical data may be multiplied by the adjustment coefficient to obtain a final reliability threshold.

It may be understood that the smaller the average value of third distances, the greater the difference in the required inspection time between the nodes, and the more sufficient the inspection time. At this time, more inspection units whose reliability of inspection results is lower than the reliability threshold may be screened out by increasing the reliability threshold, and their inspection frequency may be increased.

The reliability difference refers to a difference between the reliability and the reliability threshold.

In some embodiments, the smart gas pipeline network safety management platform 130 may adjust the required inspection time and the inspection frequency of the at least one inspection unit based on a magnitude of the reliability difference. For example, the greater the reliability difference, the earlier the inspection time and the higher the inspection frequency. It may be understood that when the reliability is greater than the reliability threshold, there is no need to adjust the inspection time or the inspection frequency of a corresponding inspection unit.

In some embodiments, the smart gas pipeline network safety management platform 130 may determine the updated required inspection time and undated inspection frequency as the updated inspection features.

In some embodiments of the present disclosure, the required inspection time and the inspection frequency of the inspection unit may be adjusted based on the reliability difference, which can improve flexibility and rationality of inspection task arrangement.

In 440, determining an updated gas inspection area based on the updated inspection features.

In some embodiments, the smart gas pipeline network safety management platform 130 may determine the updated gas inspection area by using the manner in the operation 220 based on the updated inspection features, which is not repeated herein.

In some embodiments of the present disclosure, the inspection features are updated by evaluating the reliability, and the updated inspection features are determined, so that the gas inspection area may be updated and optimized in time, thereby improving the inspection efficiency and inspection quality.

In some embodiments, the smart gas pipeline network safety management platform 130 may predict a first abnormality possibility of the at least one inspection unit based on the gas monitoring data; predict a second abnormality possibility of at least one inspection unit based on the inspection result. Further, the smart gas pipeline network safety management platform 130 may determine the reliability of the inspection result based on a consistency between the first abnormality possibility and the second abnormality possibility.

The first abnormality possibility and the second abnormality possibility refer to possibility of abnormalities occurring in the gas pipeline network in future operation, and a difference between the first abnormality possibility and the second abnormality possibility is that they are determined in different ways.

In some embodiments, the smart gas pipeline network safety management platform 130 may determine the first abnormality possibility and the second abnormality possibility by checking a preset table based on the gas monitoring data. The preset table stores a variety of different gas monitoring data and a plurality of corresponding first abnormality possibilities, as well as a plurality of different inspection results and a plurality of corresponding second abnormality possibilities. The preset table is set based on experience.

In some embodiments, the smart gas pipeline network safety management platform 130 may also predict the first abnormality possibility of the at least one inspection unit based on a first prediction model.

FIG. 5A is an exemplary schematic diagram illustrating predicting a first abnormality possibility based on a first prediction model according to some embodiments of the present disclosure.

In some embodiments, the smart gas pipeline network safety management platform 130 may predict the first abnormality possibility of at least one inspection unit through the first prediction model based on gas monitoring data, historical monitoring data, a historical abnormality condition, and a gas pipeline network map. The first prediction model may be a custom machine learning model below, or other neural network models (e.g., a convolutional neural network model).

In some embodiments, as shown in FIG. 5A, the first prediction model may include a historical abnormality extraction layer 520-1 and an abnormality prediction layer 520-2. An input of the historical abnormality extraction layer 520-1 may include historical monitoring data 510-1, a historical abnormality condition 510-2, and a gas pipeline network map 510-3, and an output may include historical abnormality features 510-4. An input of the abnormality prediction layer 520-2 may include the historical abnormality features 510-4 and gas monitoring data 510-5, and an output may include the first abnormality possibility 510-6.

The historical abnormality features refer to feature information of abnormalities occurring in the gas pipeline network in historical time.

In some embodiments, the historical monitoring data, the historical abnormality condition, and the gas monitoring data input by the first prediction model are all data of the entire gas pipeline network, and the output first abnormality possibility is the first abnormality possibility of a plurality of inspection units in the gas inspection area.

The historical monitoring data refers to gas monitoring data historically monitored.

The historical abnormality condition refers to a specific condition in which an abnormality occurs in the historical monitoring data. For example, the historical abnormality condition may include abnormality time, an abnormality location, an abnormality data type, an abnormality degree, etc. in the historical monitoring data.

In some embodiments, the historical monitoring data and the historical abnormality condition may be obtained through historical data stored in a smart gas data center.

In some embodiments, the first prediction model and the second prediction model may be obtained through joint training. Detailed descriptions may be found below.

In some embodiments of the present disclosure, the first abnormality possibility of the at least one inspection unit may be predicted by the first prediction model, which can improve prediction accuracy using a self-learning ability of the machine learning model.

In some embodiments, the smart gas pipeline network safety management platform 130 may also predict the second abnormality possibility of the at least one inspection unit based on a second prediction model.

FIG. 5B is an exemplary schematic diagram illustrating predicting a second abnormality possibility based on a second prediction model according to some embodiments of the present disclosure.

In some embodiments, the smart gas pipeline network safety management platform 130 may predict the second abnormality possibility 530-4 of at least one inspection unit through the second prediction model 540 based on an inspection result 530-1, gas flow data 530-2, and environmental data 530-3.

In some embodiments, the second prediction model may be a custom machine learning model or other neural network models (e.g., a deep neural network model).

The gas flow data refers to gas flow of pipelines or devices corresponding to different inspection units in different periods of time in a gas inspection area.

The environmental data refers to environmental data of a plurality of inspection units in the gas inspection area. For example, the environmental data may include a weather condition, a device exposure condition, etc.

In some embodiments, the smart gas pipeline network safety management platform 130 may obtain the gas flow data and the environmental data based on the smart gas pipeline network device object platform 150.

In some embodiments of the present disclosure, the second abnormality possibility is predicted by the second prediction model, which can improve prediction accuracy using a self-learning ability of the machine learning model.

In some embodiments, the smart gas pipeline network safety management platform 130 may determine a comprehensive abnormality possibility based on a consistency between the first abnormality possibility and the second abnormality possibility, and determine reliability of the inspection result based on the comprehensive abnormality possibility. For example, the comprehensive abnormality possibility may be determined by means of weighted summation. The reliability of the inspection result may be negatively correlated with the comprehensive abnormality possibility. Weights of the weighted summation may be determined based on the consistency between the first abnormality possibility and the second abnormality possibility. The higher the consistency, the closer the weights of the first abnormality possibility and the weight of the second abnormality possibility.

In some embodiments of the present disclosure, the reliability of the inspection result is comprehensively determined based on the first abnormality possibility and the second abnormality possibility, and reliability of a current inspection result may be evaluated based on an abnormality possibility of a gas pipeline network in the future, thereby improving accuracy of the reliability of the inspection result.

In some embodiments, the first prediction model and the second prediction model may be obtained through joint training. Training data of the joint training may include historical data of a plurality of same periods of time in historical inspection records, and the training data includes reliable training data and unreliable training data.

The training data may be historical gas monitoring data, historical monitoring data, a historical abnormality condition, a historical gas pipeline network map, a historical inspection result, historical environmental data, and historical gas flow data in the historical data of the plurality of same periods of time in the historical inspection records. In some embodiments, the joint training data may be determined through the historical data stored in a smart gas data center.

In some embodiments, the training data may be classified into the reliable training data and the unreliable training data based on an abnormality condition of the joint training data and a consistency of the abnormality condition.

The reliable training data refers to training data in which the historical inspection result in the historical inspection records is consistent with the abnormality condition of the gas monitoring data and is consistent with an actual abnormality condition. For example, the reliable training data may include data in which the inspection result and the gas monitoring data are abnormal, and an actual condition is also abnormal.

The unreliable training data refers to data in which the historical inspection result in the historical inspection records is not consistent with the abnormality condition of the gas monitoring data, but the abnormality condition of the gas monitoring data is consistent with the actual abnormality condition.

The actual abnormality condition includes discrepancies in a user's repair report, gas output volume, user consumption, etc.

In some embodiments, the first prediction model and the second prediction model may be obtained through joint training.

In some embodiments, the smart gas pipeline network safety management platform 130 may jointly train the first prediction model and the second prediction model based on a plurality of sets of reliable training data and a plurality of sets of unreliable training data. Each of the plurality of sets of reliable training data (or unreliable training data) may be divided into a first training sample and a second training sample. The first training sample includes sample historical monitoring data, a sample historical abnormality condition, a sample gas pipeline network map, and sample gas monitoring data in each of the plurality of sets of reliable training data (or unreliable training data). The second training sample includes a sample inspection result, sample gas flow data, and sample environmental data in each of the plurality of sets of reliable training data (or unreliable training data).

In some embodiments, the smart gas pipeline network safety management platform 130 may obtain the historical data from the smart gas data center, and determine the reliable training data and the unreliable training data therefrom. Further, each of the plurality of sets of reliable training data or unreliable training data is divided into the first training sample and the second training sample.

A first label is an actual first abnormality possibility of the at least one inspection unit corresponding to the first training sample; and a second label is an actual second abnormality possibility of the at least one inspection unit corresponding to the second training sample. Values of the first label and the second label may be determined according to a historical actual abnormality result of an inspection unit.

In some embodiments, the smart gas pipeline network safety management platform 130 may input the plurality of sets of first training samples in the reliable training data into the first prediction model to obtain an initial first abnormality possibility; construct a first loss function based on the initial first abnormality possibility and the first label; input the second training sample in the reliability training data into the second prediction model to obtain an initial second abnormality possibility; and construct a second loss function based on the initial second abnormality possibility and the second label. The smart gas pipeline network safety management platform 130 may update parameters of the first prediction model and the second prediction model respectively using the first loss function and the second loss function; and determine in real time whether prediction results of the first prediction model and the second prediction model meet a condition of completing joint training in the update process.

Similarly, the smart gas pipeline network safety management platform 130 may train the first prediction model and the second prediction model respectively using the plurality of sets of first training samples and the plurality of sets of second training samples in the unreliable training data, and determine whether prediction results of the first prediction model and the second prediction model meet the condition of completing joint training.

When the training based on the reliability training data and the training based on the unreliability training data both meet the condition of completing joint training, a trained first prediction model and a trained second prediction model are obtained.

In some embodiments, the condition of completing joint training includes that for same reliable training data, a prediction difference value between the first prediction model and the second prediction model is smaller than a first training threshold; and for same unreliable training data, a prediction difference value between the first prediction model and the second prediction model is greater than a second training threshold.

The prediction difference value refers to a difference between the first abnormality possibility and the second abnormality possibility.

The first training threshold refers to a maximum difference value that needs to be met by the prediction difference value when the joint training is performed based on the reliable training data.

The second training threshold refers to a minimum difference value that needs to be met by the prediction difference value when the joint training performed based on the unreliable training data.

It may be understood that the more reliable the data, the closer the prediction result of the first prediction model and the prediction result of the second prediction model.

In some embodiments of the present disclosure, the first prediction model and the second prediction model are jointly trained based on the reliable training data and the unreliable training data, and the conditions of completing joint training are respectively set for the joint training based on the reliable training data and the joint training based on the unreliable training data, which may mutually correct the joint trainings performed on the models based on the opposite training data, thereby improving training effect of the first prediction model and the second prediction model.

In some embodiments of the present disclosure, compared with training of a single model, the training effect can be improved through the joint training of the first prediction model and the second prediction model.

Some embodiments of the present disclosure also disclose a non-transitory computer-readable storage medium, which stores computer instructions. When a computer reads the computer instructions in the storage medium, the computer executes the method for management of pipeline network inspection based on the smart gas GIS.

Having thus described the basic concepts, it may be rather apparent to those skilled in the art after reading this detailed disclosure that the foregoing detailed disclosure is intended to be presented by way of example only and is not limiting. Although there is no clear explanation here, those skilled in the art may make various modifications, improvements, and corrections for the present disclosure. Such modifications, improvements, and corrections are suggested in the present disclosure, so such modifications, improvements, and corrections still within the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that two or more references to "an embodiment" or "an embodiment" or "an alternative embodiment" in different places in the present disclosure do not necessarily refer to the same embodiment. In addition, certain features, structures, or characteristics in one or more embodiments of the present disclosure may be properly combined.

Furthermore, unless explicitly stated in the claims, the order of processing elements and sequences, the use of alphanumeric, or the use of other names described in the present disclosure is not intended to limit the order of the processes and methods of the present disclosure. While the above disclosure discusses some presently believed useful embodiments of the invention by way of various examples, it is to be understood that such details are for purposes of illustration only and that the appended claims are not limited to the disclosed embodiments, but on the contrary, the claims are intended to cover all modifications and equivalent combinations that come within the spirit and scope of the embodiments of the present disclosure. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this approach of disclosure does not imply that the features required by the present disclosure are more than the features recited in the claims. Rather, claimed subject matter may lie in less than all features of a single foregoing disclosed embodiment.

In some embodiments, numbers describing the count of components and attributes are used. It should be understood that such numbers used in the description of the embodiments are modified with the modifiers "about", "approximately" or "substantially" in some examples. Unless otherwise stated, "about", "approximately" or "substantially" indicates that the stated figure allows for a variation of ±20%. Correspondingly, in some embodiments, the numerical parameters used in the description and claims are approximate values, and the approximate values may be changed according to the required characteristics of individual embodiments. In some embodiments, numerical parameters should take into account the specified significant digits and adopt the manner of general digit reservation. Although the numerical ranges and parameters used in some embodiments of the present disclosure to confirm the breadth of the range are approximations, in specific embodiments, such numerical values are set as precisely as practicable.

Each patent, patent application, patent application publication, and other material, such as article, book, specification, publication, document, etc., cited in the present disclosure is hereby incorporated by reference in its entirety. Historical application documents that are inconsistent with or conflict with the content of the present disclosure are excluded, and documents (currently or later appended to the present disclosure) that limit the broadest scope of the claims of the present disclosure are excluded. It should be noted that if there is any inconsistency or conflict between the descriptions, definitions, and/or terms used in the accompanying materials of the present disclosure and the contents of the present disclosure, the descriptions, definitions, and/or terms used in the present disclosure shall prevail.

Finally, it should be understood that the embodiments described in the present disclosure are only configured to illustrate the principles of the embodiments of the present disclosure. Other modifications are also possible within the scope of the present disclosure. Therefore, as an example and not a limitation, alternative configurations of the embodiments of the present disclosure may be regarded as consistent with the teaching of the present disclosure. Correspondingly, the embodiments of the present disclosure are not limited to the embodiments clearly introduced and described in the present disclosure.

What is claimed is:

1. A method for management of pipeline network inspection based on a smart gas geographic information system (GIS), wherein the method is implemented by a smart gas pipeline network safety management platform of an Internet of Things system for management of pipeline network inspection based on the smart gas GIS, and the method comprises:

obtaining inspection features of at least one inspection unit in a gas pipeline network based on the smart gas GIS, wherein the inspection features include at least one of location features, required inspection time, inspection frequency, or a pipeline system of the at least one inspection unit;

constructing a gas inspection graph based on the gas pipeline network map; wherein nodes of the gas inspection graph include the at least one inspection unit, and edges of the gas inspection graph include first type edges; and the first type edges are pipelines between the nodes;

determining at least one inspection sub-graph by clustering the gas inspection graph based on the inspection features, wherein a count of the clustering is determined based on a type and a count of various inspectors, the edges of the gas inspection graph also include second type edges which are edges between nodes that are not directly connected to each other by gas pipelines, and weights of the first type edges and the second type edges are determined based on distances between the nodes and types of the first type edges and the second type edges;

determining the at least one gas inspection area based on the at least one inspection sub-graph;

determining an inspection result by performing an inspection based on the at least one gas inspection area; and updating the at least one gas inspection area based on the inspection result, wherein the updating the at least one gas inspection area based on the inspection result comprises:

obtaining gas monitoring data;

evaluating reliability of the inspection result based on a consistency between the gas monitoring data and the inspection result;

determining updated inspection features by updating the inspection features based on the reliability of the inspection result; and determining an updated gas inspection area based on the updated inspection features, wherein the evaluating reliability of the inspection result based on a consistency between the gas monitoring data and the inspection result comprises:

predicting a first abnormality possibility of the at least one inspection unit based on the gas monitoring data;

predicting a second abnormality possibility of the at least one inspection unit based on the inspection result; and determining the reliability of the inspection result based on a consistency between the first abnormality possibility and the second abnormality possibility.

2. An Internet of Things system for management of pipeline network inspection based on a smart gas geographic information system (GIS), wherein the Internet of Things system includes a smart gas user platform, a smart gas service platform, a smart gas pipeline network safety management platform, and a smart gas pipeline network device sensing network platform, a smart gas pipeline network device object platform;

the smart gas user platform includes a plurality of smart gas user sub-platforms;

the smart gas service platform includes a plurality of smart gas service sub-platforms;

the smart gas pipeline network safety management platform includes at least one smart gas pipeline network safety management sub-platform and a smart gas data center;

the smart gas pipeline network device sensing network platform is configured to interact with the smart gas data center and the smart gas pipeline network device object platform;

the smart gas pipeline network device object platform is configured to obtain inspection features of at least one inspection unit in a gas pipeline network, wherein the inspection features include at least one of location features, required inspection time, inspection frequency, or a pipeline system of the at least one inspection unit;

the smart gas pipeline network safety management platform is configured to obtain the inspection features from the smart gas data center;

the smart gas pipeline network safety management platform is further configured to:

construct a gas inspection graph based on the gas pipeline network map, wherein nodes of the gas inspection graph include the at least one inspection unit, and edges of the gas inspection graph include first type edges; and the first type edges are pipelines between the nodes;

determine at least one inspection sub-graph by clustering the gas inspection graph based on the inspection features, wherein a count of the clustering is determined based on a type and a count of various inspectors, the edges of the gas inspection graph further include second type edges which are edges between nodes that are not directly connected to each other by gas pipelines, and weights of the first type edges of the second type edges are determined based on distances between the nodes and types of the first type edges and types of the second type edges;

determine the at least one gas inspection area based on the at least one inspection sub-graph;

determine an inspection result by performing an inspection based on the at least one gas inspection area; and update the at least one gas inspection area based on the inspection result;

the smart gas pipeline network safety management platform is further configured to:

obtain gas monitoring data;

evaluate reliability of the inspection result based on a consistency between the gas monitoring data and the inspection result;

determine updated inspection features by updating the inspection features based on the reliability of the inspection result; and determine an updated gas inspection area based on the updated inspection features;

the smart gas pipeline network safety management platform is further configured to:

determine the reliability of the inspection result of the at least one inspection unit in the gas inspection area and a reliability difference between the reliability of the inspection result and a reliability threshold;

adjust the required inspection time and the inspection frequency of the at least one inspection unit based on the reliability difference;

determine the updated inspection features by updating the inspection features based on updated required inspection time and updated inspection frequency; and transmit the at least one gas inspection area after updating to the smart gas service platform through the smart gas data center; and the smart gas service platform is configured to upload the at least one gas inspection area after updating to the smart gas user platform.

* * * * *